(12) United States Patent
Schaefér (10) Patent No.: US 9,087,559 B2
(45) Date of Patent: Jul. 21, 2015

(54) MEMORY SENSE AMPLIFIER VOLTAGE MODULATION

(71) Applicant: Intel Corporation, Santa Clara, CA (US)

(72) Inventor: Andre Schaefér, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 13/728,749

(22) Filed: Dec. 27, 2012

(65) Prior Publication Data

US 2014/0185392 A1    Jul. 3, 2014

(51) Int. Cl.
| G11C 7/08 | (2006.01) |
| G11C 11/4074 | (2006.01) |
| G11C 11/4091 | (2006.01) |

(52) U.S. Cl.
CPC .............. *G11C 7/08* (2013.01); *G11C 11/4074* (2013.01); *G11C 11/4091* (2013.01)

(58) Field of Classification Search
CPC ...... G11C 5/147; G11C 5/148; G11C 4/4074; G11C 7/08; G11C 11/4047; G11C 11/4091
USPC .................. 365/189.11, 226, 227, 206, 205, 365/189.011
See application file for complete search history.

(56) References Cited

U.S. PATENT DOCUMENTS

| 7,038,963 | B2 | 5/2006 | Lee |
| 7,719,911 | B2* | 5/2010 | Teramoto et al. ............. 365/206 |
| 7,852,686 | B2* | 12/2010 | Chung et al. ............. 365/189.11 |
| 7,929,367 | B2* | 4/2011 | Yoo et al. ....................... 365/222 |
| 7,960,951 | B2* | 6/2011 | Southwell et al. ............. 323/272 |
| 8,213,250 | B2* | 7/2012 | Song .............................. 365/205 |
| 8,446,753 | B2* | 5/2013 | Kim et al. ...................... 365/148 |
| 8,493,812 | B2* | 7/2013 | Dengler et al. .......... 365/230.06 |
| 8,547,769 | B2* | 10/2013 | Saraswat et al. ............... 365/226 |
| 2004/0165462 | A1 | 8/2004 | Morgan |
| 2005/0169090 | A1* | 8/2005 | Shau ......................... 365/230.03 |
| 2007/0257650 | A1* | 11/2007 | Southwell et al. ............. 323/283 |
| 2009/0016139 | A1* | 1/2009 | Teramoto et al. ............. 365/226 |
| 2009/0251975 | A1* | 10/2009 | Chung et al. ............. 365/189.11 |
| 2011/0157962 | A1 | 6/2011 | McElroy et al. |
| 2011/0235391 | A1* | 9/2011 | Kim et al. ...................... 365/148 |
| 2012/0039143 | A1 | 2/2012 | Katoch |

(Continued)

OTHER PUBLICATIONS

International Search Report and Written Opinion of the International Searching Authority dated Sep. 26, 2013, in International Patent Application No. PCT/US2013/045438, 10 pages.
Takayuki Kawahara et al., "A Circuit Technology for Sub-10-ns ECL 4-Mb BiCMOS DRAM's," IEEE Journal of Solid-State Circuits, vol. 26, No. 11, Nov. 1991.

(Continued)

*Primary Examiner* — Douglas King
*Assistant Examiner* — Jerome Leboeuf
(74) *Attorney, Agent, or Firm* — Blakely, Sokoloff, Taylor & Zafman LLP (57) ABSTRACT

Memory sense amplifier voltage modulation. An embodiment of a an apparatus includes a memory including a sense amplifier; a first node for an high voltage rail for the sense amplifier and a second node for a low voltage rail for the sense amplifier; one or more elements to provide a first voltage to the first node and a second voltage to the second node; and a voltage control engine to control the one or more elements, where the voltage control engine is to independently set a value of the first voltage and a value of the second voltage over time.

25 Claims, 7 Drawing Sheets

(56) References Cited

U.S. PATENT DOCUMENTS

2012/0106237 A1* 5/2012 Dengler et al. ............... 365/154
2012/0133399 A1 5/2012 Watanabe et al.
2012/0250443 A1* 10/2012 Saraswat et al. ............. 365/226
2014/0286117 A1* 9/2014 Takahashi ..................... 365/205

OTHER PUBLICATIONS

Przybylski, Steven A., "Cache and Memory Hierarchy Design: A Performance-Directed Approach," Morgan Kaufmann, 1990, Chapter 29, "Power and Leakage," p. 847.

* cited by examiner

MEMORY SENSE AMPLIFIER VOLTAGE MODULATION

TECHNICAL FIELD

Embodiments of the invention generally relate to the field of electronic devices and, more particularly, memory sense amplifier voltage modulation.

BACKGROUND

A computer memory, such as Dynamic Random Access Memory (DRAM), may include sense amplifiers (or "sense amps") for use in reading the content of memory cells. In conventional DRAM architectures, a sense amplifier referred to as a primary sense amplifier (PSA) is connected to DRAM internal power rails and DRAM internal power generation, which are controlled by the DRAM internal logic.

However, in such a memory architecture the behavior of the sense amplifier is established by the system architecture. The established voltages generally do not vary based on workload factors, and are not accessible outside of the memory device. For this reason, the voltage levels of the DRAM internal power rails sense amplifier are generally not at levels that will best provide for efficient operation, or that will best protect circuit elements from current shorts that may develop in operation of the memory.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to memory sense amplifier voltage modulation.

As used herein:

"3D stacked memory" (where 3D indicates three-dimensional) or "stacked memory" means a computer memory including one or more coupled memory die layers, memory packages, or other memory elements. The memory may be vertically stacked or horizontally stacked (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics processing unit (GPU).

A computer DRAM memory, including a stacked memory device or other DRAM, may include a primary sense amplifier that provides for sensing of memory contents. A sense amplifier generally is coupled with an upper voltage rail (PSA_high_rail) and a lower voltage rail (PSA_low_rail), where the upper voltage rail is at a higher voltage potential than the lower voltage rail.

In a stacked DRAM device (such as a memory device compatible with the Wide I/O standard (Wide I/O Single Data Rate, JEDEC Standard JESD229, December 2011)), one or more DRAM wafers (or dies) in a memory stack may be stacked with a system element such as a system on chip (SoC) wafer in the same package. The stacked memory may utilize through silicon via (TSV) manufacturing techniques, where vias are produced through silicon dies to provide signal and power paths through the memory stack.

A stacked memory device may include a system chip and one or more DRAM chips, the DRAM chips forming memory strata or layers coupled with the system chip. Each memory stratum may include a plurality of tiles (or portions) of memory. The stacked memory device may include multiple channels, where a channel may include a column of tiles, such as a tile in each of the strata of the memory device. In some embodiments, a memory device may be a memory device that is compatible with the Wide I/O standard.

In computer memory, a sense amplifier is utilized in the reading of data from memory, the sense amplifier including a certain number of transistors. In some embodiments, a memory includes access to the memory internal voltages for a primary sense amplifier. In some embodiments, a DRAM array internal PSA_high and PSA_low voltage rails for the primary sense amplifier are externally exposed to allow control over sense amplifier operation and power usage. In some embodiments, the DRAM internal PSA voltage rails are accessed by a control and tuning engine that controls the voltage values of each of the rails, and the relationship of such voltage values to each other over time.

In some embodiments, an apparatus, system, or method provides for controlling the values of DRAM PSA voltages over time may be controlled for purposes of controlling and balancing the speed and power efficiency of the memory sensing process. In some embodiments, the sensing process may be adjusted to avoid short-currents and unnecessary loading of parasitic capacitances. For example, the operation of a sense amplifier may include a boosting phase where an upper rail voltage is at a higher than a normal level and a lower rail voltage is at a lower than a normal level to boost operational speed. In some embodiments, the operation may further include a protection phase where the lower rail voltage is increased in order to prevent or mitigate short current conditions through sense amplifier transistors, such as during conditions in which NFET and PFET elements are open.

In some embodiments, a control and tuning engine is a portion of a memory. In some embodiments, a control and tuning engine is a part of a memory controller that is external to the memory and that interacts with the memory, such as an external memory controller chip that interacts with power gating transistors on the DRAM side of a device. In some embodiments, the control and tuning engine provides for modulation of both the high and low rail voltages over time. In some embodiments, the control and tuning engine provides for independent control over the high and low rail voltages, such that, for example, the low rail voltage may be modified at a first point in time and the high rail voltage may be modified at a second point in time, the first and second points in time being different.

In some embodiments, an apparatus, system, or method includes elements for:

(1) Linking modulation of DRAM primary sense amplifier voltages to a voltage controller engine that is steered by the memory controller of the DRAM, where the memory controller is hosted on a logic die of the DRAM.

(2) Independently modulating both the higher and lower rail voltages over time to adjust the relationship between such voltages to obtain improved workload dependent PSA sensing behavior and to prevent short currents through the sense amplifier transistors.

Figure 1:
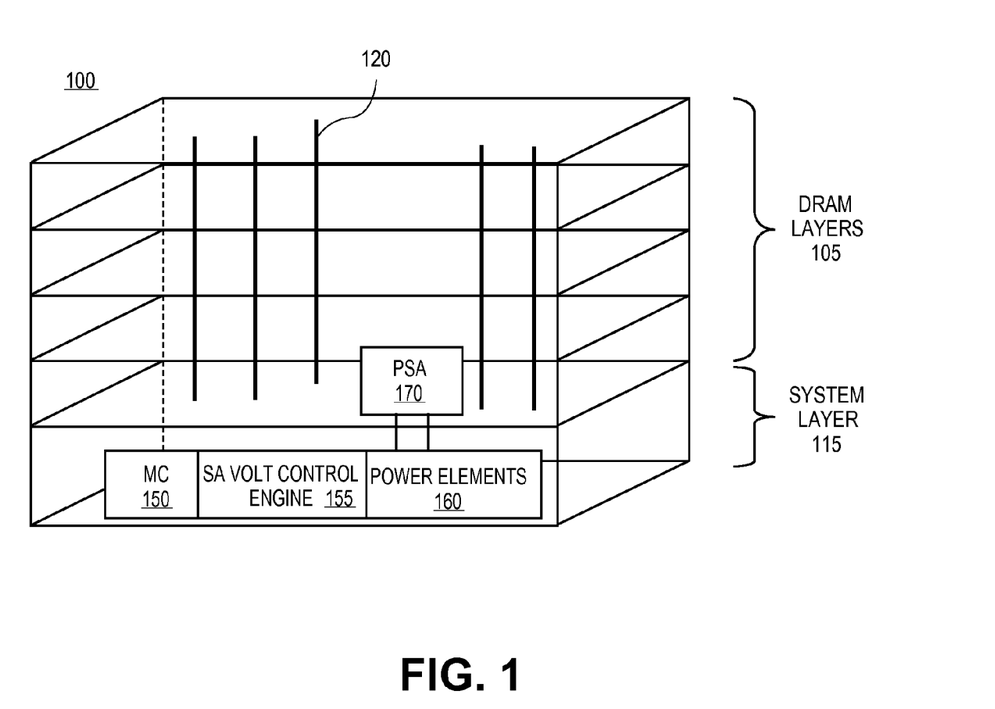
FIG. 1 is an illustration of an embodiment of a three-dimensional stacked memory device with sense amplifier voltage modulation.

FIG. 1 is an illustration of an embodiment of a 3D stacked memory device with sense amplifier voltage modulation. In this illustration, a 3D stacked memory device 100, such as a Wide I/O memory device, includes a system layer or other element 115. The system element 115 is coupled with one or more DRAM memory die layers 105, also referred to herein as the memory stack. In some embodiments, the system element 115 may be an SoC (System on Chip) or other similar element. In this illustration, the DRAM memory die layers include four memory die layers. However, embodiments are not limited to any particular number of memory die layers in the memory stack. Each die layer may include elements related to the stacked memory structure, including, for example, a temperature compensated self-refresh (TCSR) circuit to address thermal issues, where the TCSR and a mode register may be a part of management logic of the device.

Among other elements, the system element 115 may include a memory controller 150, such as a Wide I/O memory controller, for the memory stack 105. In some embodiments, each memory die layer, with the possible exception of the top (or outermost) memory die layer of the memory stack, includes a plurality of TSVs 120 to provide signal and power paths through the memory die layers. While a small number of TSVs are provided in FIG. 1 for ease of illustration, an actual number of TSVs would be much greater.

In some embodiments, the memory device 100 includes modulation of sense amplifier voltage. In some embodiments, the modulation of sense amplifier voltage includes independent variation of high and low voltage rail values. In this illustration, a DRAM layer includes a primary sense amplifier 170, where nodes to modulate the high and low voltage rails for the primary sense amplifier 170 are exposed to external control. In some embodiments, a system layer 115 includes power elements, such transistors that are switched to apply varying high and low rail voltages over time to the nodes of the primary sense amplifier 160. In some embodiments, the power elements are controlled by a sense amplifier voltage control engine 155. In some embodiments, the control engine 155 is a part of the memory controller 150.

Figure 2:
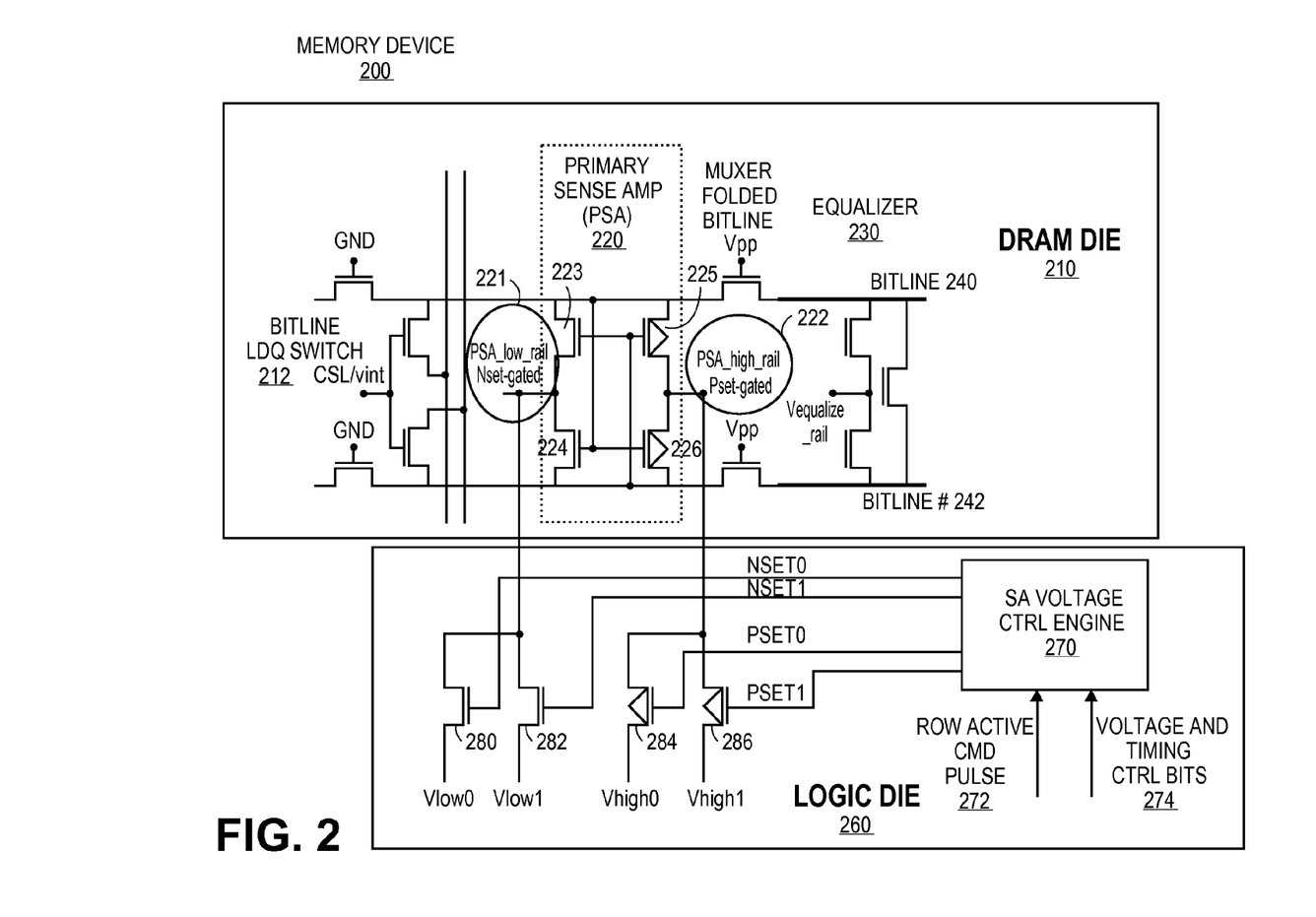
FIG. 2 is an illustration of an embodiment of a memory providing modulation of sense amplifier voltages.

FIG. 2 is an illustration of an embodiment of a memory providing modulation of sense amplifier voltages. In some embodiments, a memory device 200 includes one or more DRAM dies, including a first DRAM die 210, and a logic die 260 that is coupled with the DRAM die. In some embodiments, the memory device 200 is a stacked memory device including a multiple memory dies in a memory stack, such as, for example, the memory stack illustrated in FIG. 1.

In some embodiments, the DRAM die 210 includes bitline local data (LDQ) switch 212 coupled to a bitline pair (bitline 240/bitline #242 in a folded bitline architecture) by transistors switched by a column select (CSL). The DRAM further includes a primary sense amplifier 220 including four sense amplifier transistors, the sense amplifier transistors being a first n-channel MOS field-effect transistor (NFET) 223, a second NFET 224, a first p-channel MOS field effect transistor (PFET) 225, and a second PFET 226. In some embodiments, the primary sense amplifier 220 includes a first exposed power node PSA_low_rail 221 and a second exposed power node PSA_high_rail 222, such power nodes being exposed to logic elements for control of rail voltage. In some embodiments, the first power node 221 and the second power node 222 provide access to adjust voltage rail values for the primary sense amplifier. The DRAM die further includes an equalizer 230 to connect the bitlines with the Vequalize_rail during the bitline Precharge operation that is required before each PSA sensing operation.

In some embodiments, the logic die 260 includes a sense amplifier voltage control engine 270 (which may be referred to herein as the control engine), wherein the control engine 270 operates to steer the connection of the power rails for the primary sense amplifier through the application of one or more voltages. In some embodiments, the voltages may include multiple lower rail voltage values, illustrated as Vlow0 and Vlow1, multiple upper rail voltage values, illustrated as Vhigh0 and Vhigh1.

In some embodiments, the control engine may include multiple signal lines to switch multiple transistors or other switches to apply any of the lower rail voltages to node PSA_low_rail 221 and any of the upper rail voltages to node PSA_high_rail 222. In some embodiments, the sense amplifier control engine 270 is operable to produce a plurality of signals on the signal lines to enable the application of upper and lower rail voltages. In FIG. 2, the control engine 270 produces signal NSET0 to enable Vlow0 by switching NFET 280; NSET1 to enable Vlow1 by switching NFET 282; PSET0 to enable Vhigh0 by switching PFET 284; and PSET1 to enable Vhigh1 by switching PFET 286.

In some embodiments, the control engine 270 receives control inputs to direct the operation of the control engine in choosing the power rails values. In this illustration, the control engine 270 receives a row active command pulse 272 and voltage and timing control bits 274, where the voltage and timing control bits control which of the upper and lower rail voltages are enabled at different points in time.

However, embodiments are not limited to the particular DRAM and logic structure illustrated in FIG. 2, and, for example, other implementations and splits of building blocks between the DRAM and the logic die are possible.

Figure 3:
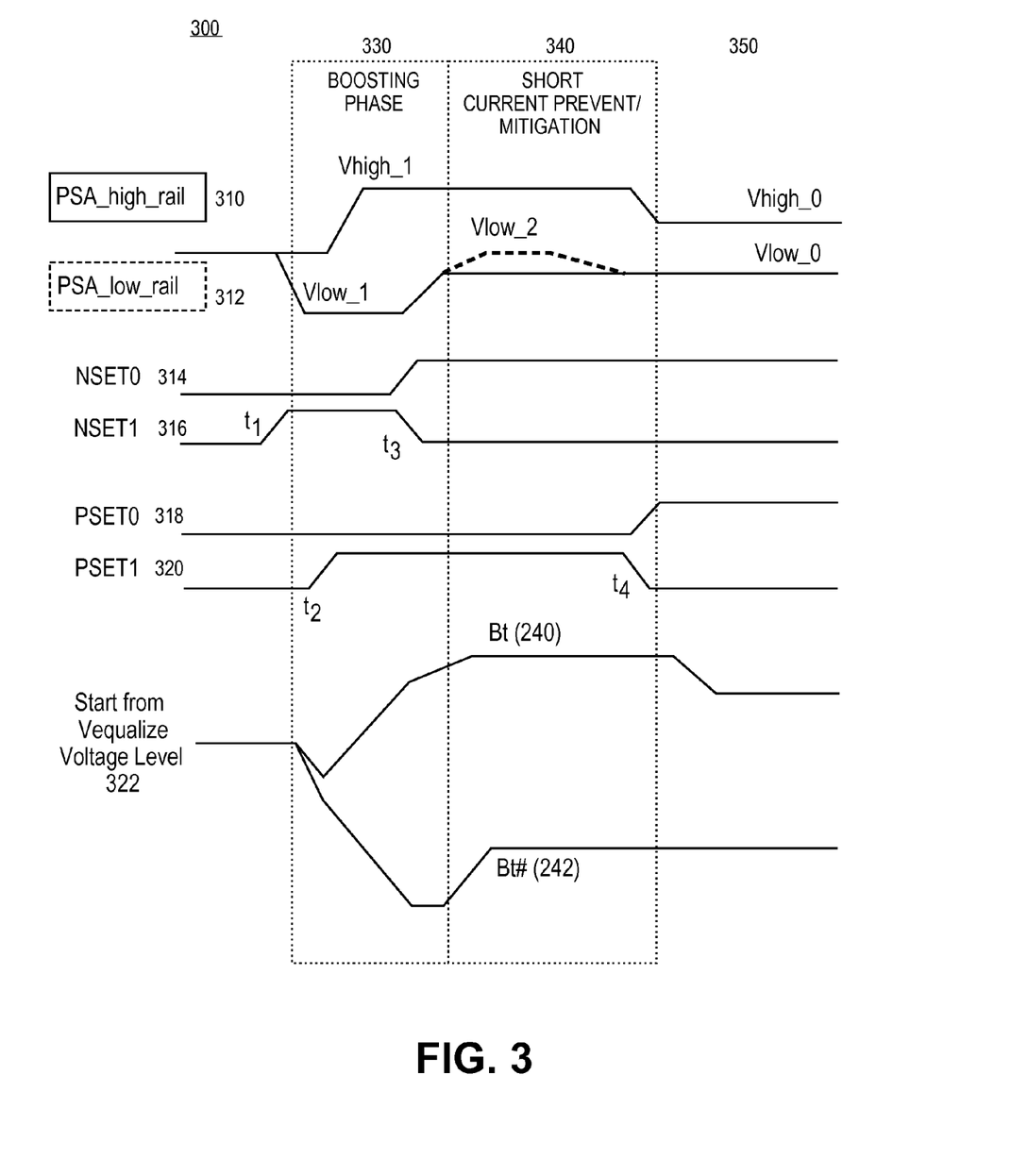
FIG. 3 is an illustration of timing operations for an embodiment of an apparatus or system including voltage modulation of upper and lower voltage rails for a sense amplifier.

FIG. 3 is an illustration of timing operations for an embodiment of an apparatus or system including voltage modulation of upper and lower voltage rails for a sense amplifier. In this illustration, timing diagrams 300 are provided for node PSA_high_rail 310 and node PSA_low_rail 312; signal NSET0 314; signal NSET1 316; PSET0 318; PSET1 320; and the resulting bitline voltages at the bitline pair bt and bt#. Voltages at bt and bt# start from the equalize voltage 322 after precharging the bitlines, an operation that is required before the PSA sensing operation. The timing diagrams are illustrated for a boosting phase 330; a protection (short current prevention/mitigation) phase 340; and a following normal phase 350. In this particular operation, the initial sensing is boosted in the boosting phase 330 through a lower than typical lower rail voltage at PSA_low_rail (which may be implemented at a first time $t_1$) and a higher than typical upper rail voltage at PSA_high_rail (which may be implemented at a second time $t_2$). In this example, in the following protection phase 340 the lower rail voltage at PSA_low_rail is increased (such as at a third time $t_3$) to mitigate the short current from PSA_high_rail to PSA_low_rail through the sense amplifier transistors when the NFET and PFET elements are open, while maintaining the higher than typical upper rail voltage on PSA_high_rail.

In the illustrated operation, in the boosting phase 330 there is an effort to initially provide a Vlow_1 value on node PSA_low_rail by enabling NSET1 316, followed by the generation of a Vhigh_1 value on PSA_high_rail by the enabling of PSET1 320. At the end of the boosting phase 330, the lower rail voltage on PSA_low_rail is increased to Vlow_2 by enabling NSET0 314 and disabling NSET1 316. In the following normal phase 350 the boosted PSA_high_rail voltage is reduced to a typical value (such as at a fourth time $t_4$) by enabling PSET0 318 and disabling PSET1 320.

As illustrated in FIG. 3, for the voltage 322 on bitline pair Bt (240) and Bt# (242), a resulting upper voltage at bt may increase through the boosting phase 330 to a steady state level in the protection phase 340, which then is reduced in the normal phase 340. Further, a resulting lower voltage at bt# may fall through the boosting phase 330 until NSET0 is enabled and NSET1 is disabled, then rising to a steady state value in the protection phase 340 that is maintained in the normal phase 350.

However, embodiments are not limited to the particular operations shown in FIG. 3. For example, a boost mode and a protection sensing mode are not necessarily connected. In some cases a boost mode may be performed without a successive protection mode, and a protection mode does not require a higher than normal Vhigh voltage, such as provided in a boost phase, to commence a sensing process. Further, the independent control and timing of the voltage of the PSA_high_rail and the voltage of the PSA_low_rail have be used for different purposes than the boost phase and the protection phase illustrated in FIG. 3.

In some embodiments, the sense amplifier control engine is utilized in a calibration procedure, where the NSET_x and PSET_x timings are set to reduce leakage or latency of the DRAM access respectively. In some embodiments, a training process is implemented prior to normal operation, with generated settings from the training process may be applied on the DRAM die, or may be applied on a finer granularity, such as applying generated settings on a DRAM bank by bank or row by row, or sub-row by sub-row, basis.

Figure 4:
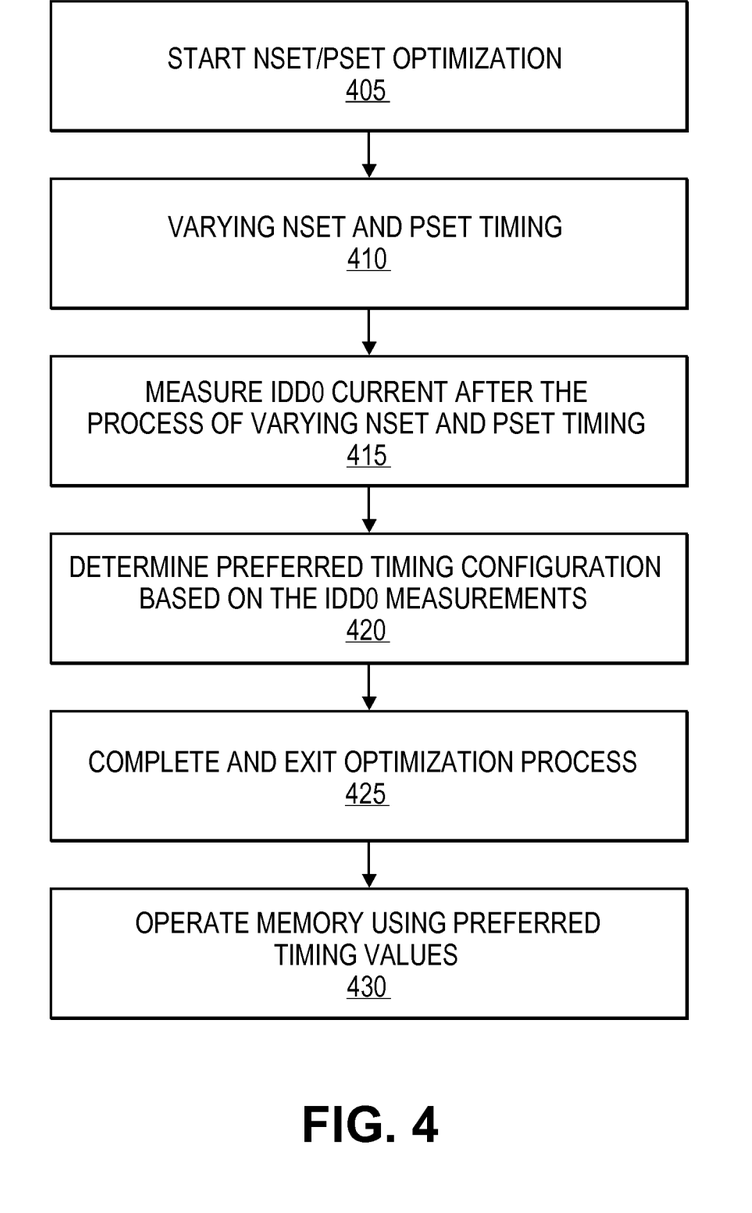
FIG. 4 is an illustration of an embodiment of a process for low leakage calibration for an apparatus providing for modulation of sense amplifier voltages.

FIG. 4 is an illustration of an embodiment of a process for low leakage calibration for an apparatus providing for modulation of sense amplifier voltages. In this illustration, a process for calibration of a memory device (or portion of a memory device) includes starting an NSET/PSET optimization 405, referring to a process for choosing optimum or preferred timing for the switching of NSET and PSET values (NSET_x and PSET_x) for a memory device. In some embodiments, the process includes varying PSET and NSET timing 410, such as sweeping through differing timing values for changes to the PSET and NSET values in the memory device.

In some embodiments, the IDD0 leakage current is measured in the platform after the changing of the PSET and NSET timings 415. In some embodiments, based on the measured IDD0 current values an optimal (or preferred) timing configuration may be determined 420, followed by completing and exiting the optimization process 425. In some embodiments, the optimization process may be followed by operation of the memory using the determined preferred NSET and PSET timing 430.

Figure 5:
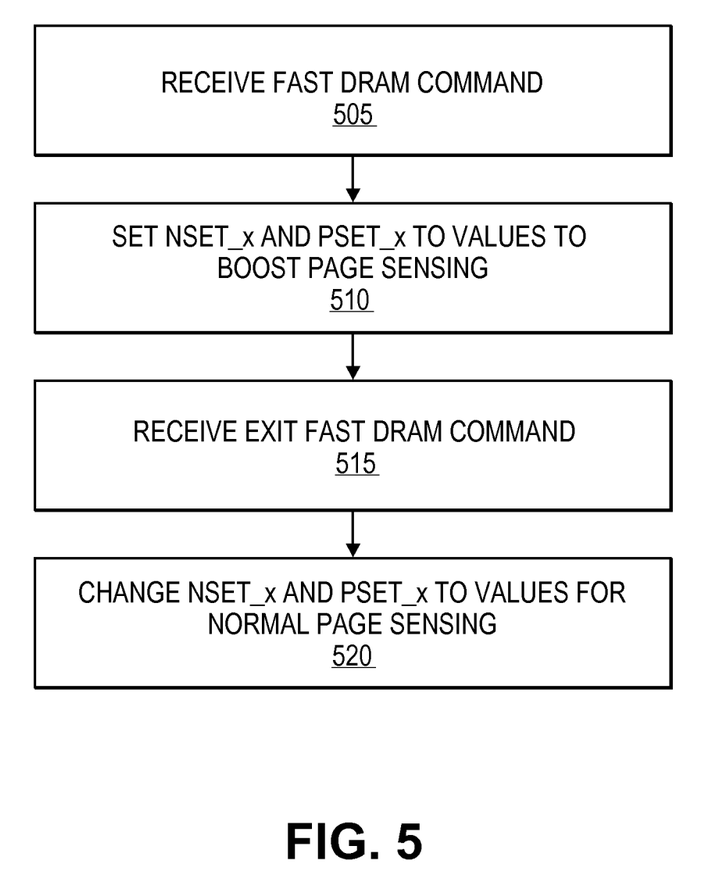
FIG. 5 is an illustration of an embodiment of a process for latency speedup on demand in operation of a memory by enabling fast PSA sensing for every row activation.

FIG. 5 is an illustration of an embodiment of a process for latency speedup on demand in operation of a memory by enabling fast PSA sensing for each row activation. In some embodiments, the process for latency speed up may follow a process for choosing preferred NSET and PSET timing, such as, for example, the process illustrated in FIG. 4. In some embodiments, a Fast DRAM command may be received 505, resulting in changing PSET_x and NSET_x to boost page sensing in a boosting phase 510, such as by setting a lower rail voltage to a lower than normal voltage at a first time and setting an upper rail voltage to a higher than normal voltage at a second time for every row activation cycle followed after switching to FAST DRAM mode.

In some embodiments, after a certain period of FAST DRAM mode operation, an Exit Fast DRAM Operation command may be received 515, resulting in changing the PSET_x and NSET_x timings during row activation to normal page sensing states 520. In some embodiments, the process may include a protection phase to avoid or mitigate short current circumstances, such as by increasing the lower rail voltage to a normal voltage at a third time, followed by a normal phase, which may include decreasing the upper rail voltage to a normal voltage at a fourth time. However, embodiments are not limited to this particular set of operations, and the values of the upper and lower rail voltages and the timings of the changes in voltages may be used for other operations and phases.

Figure 6:
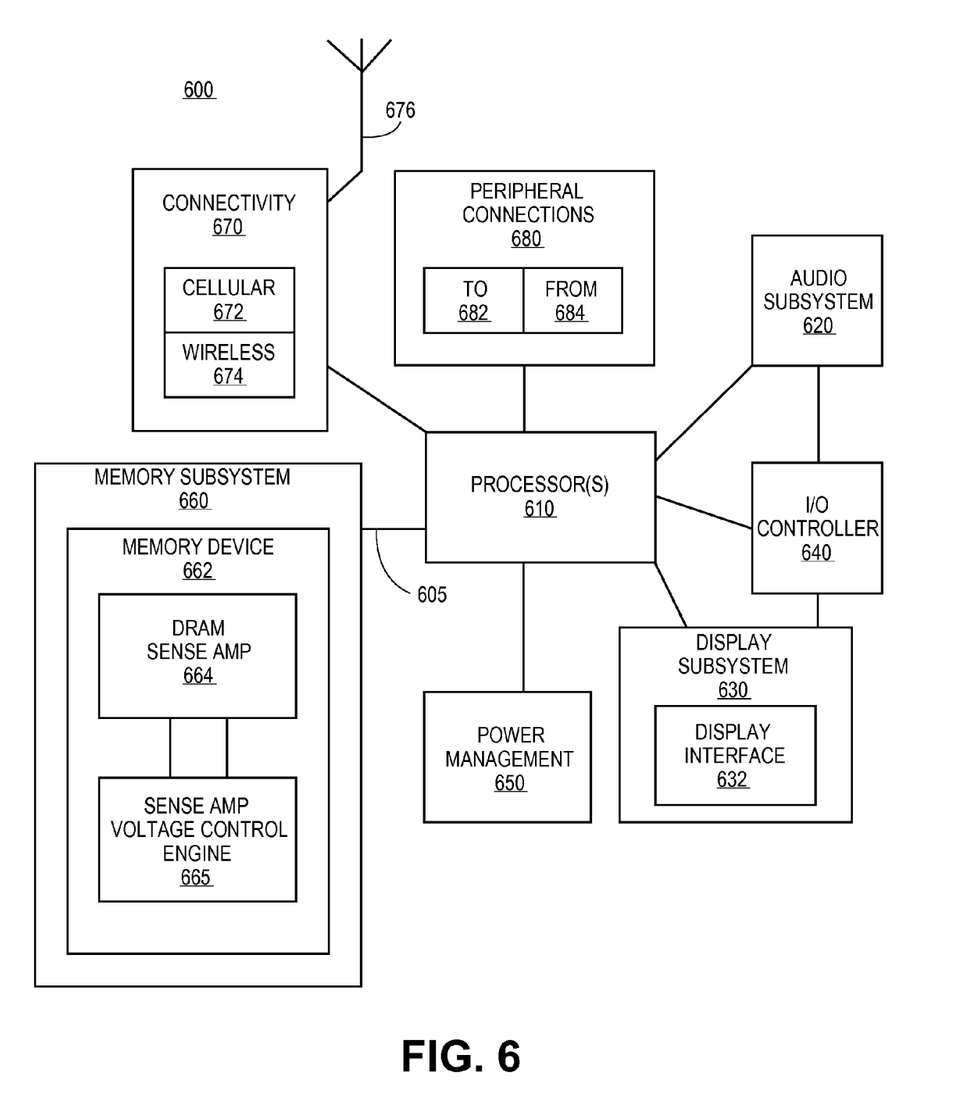
FIG. 6 is an illustration of an embodiment of an apparatus or system including modulation of sense amplifier voltages.

FIG. 6 is an illustration of an embodiment of an apparatus or system including modulation of sense amplifier voltages. Computing device 600 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as system data (whether long-term or temporary) related to the execution of the applications and functions of system 600.

In some embodiments, the memory subsystem 660 may include a memory device 662, such as a stacked memory device, wherein the memory device includes a DRAM sense amplifier 664 having exposed nodes for upper and lower rail voltages of the sense amplifier, and further including a sense amplifier voltage control engine 665 that provides for independent modulation of the sense amplifier upper rail voltage and lower rail voltage over time.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 676.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 7:
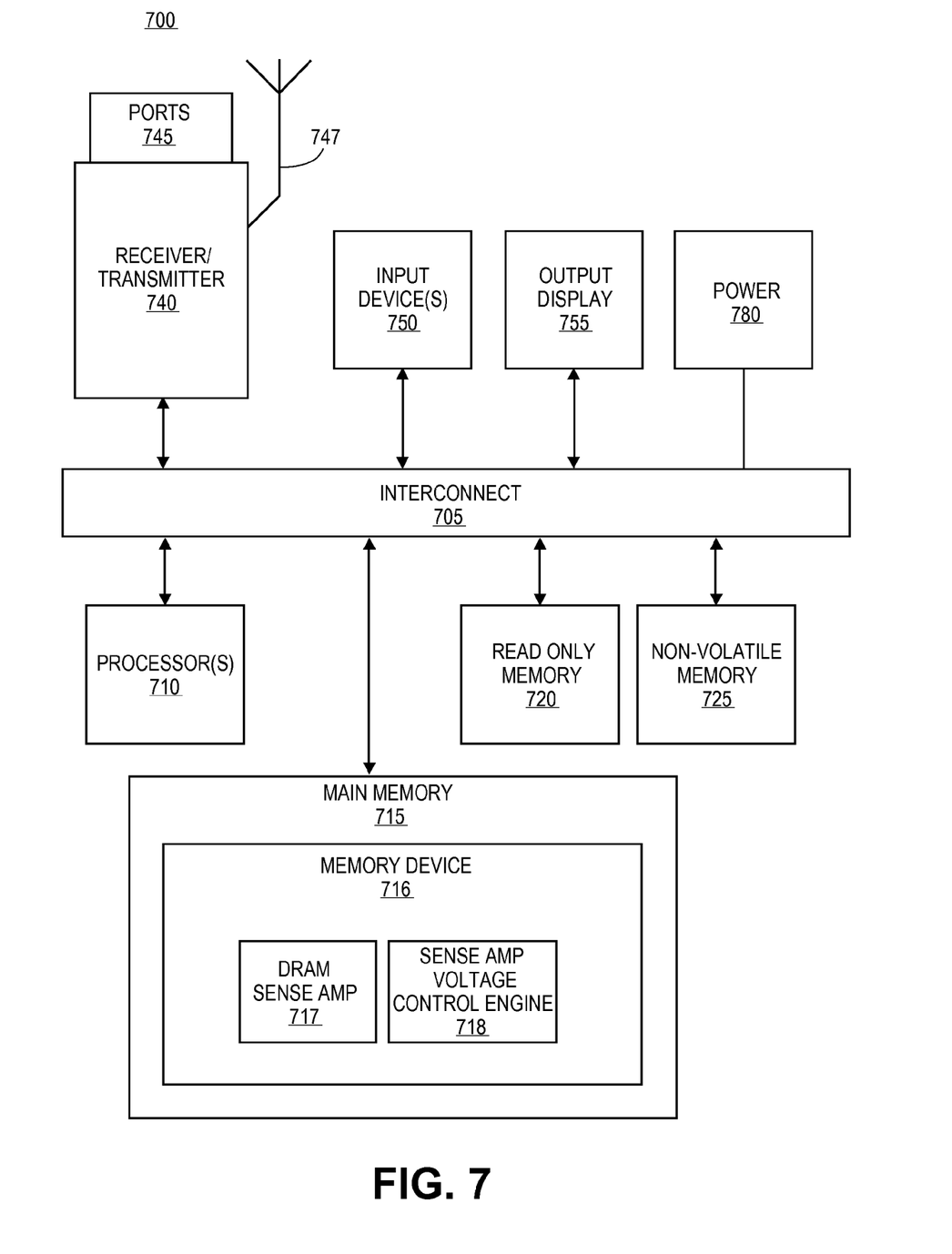
FIG. 7 is illustrates an embodiment of a computing system providing for modulation of sense amplifier voltages.

FIG. 7 illustrates an embodiment of a computing system providing for modulation of sense amplifier voltages. The computing system may include a computer, server, game console, or other computing apparatus. In this illustration, certain standard and well-known components that are not germane to the present description are not shown. Under some embodiments, the computing system 700 comprises an interconnect or crossbar 705 or other communication means for transmission of data. The computing system 700 may include a processing means such as one or more processors 710 coupled with the interconnect 705 for processing information. The processors 710 may comprise one or more physical processors and one or more logical processors. The interconnect 705 is illustrated as a single interconnect for simplicity, but may represent multiple different interconnects or buses and the component connections to such interconnects may vary. The interconnect 705 shown in FIG. 7 is an abstraction that represents any one or more separate physical buses, point-to-point connections, or both connected by appropriate bridges, adapters, or controllers.

In some embodiments, the computing system 700 further comprises a random access memory (RAM) or other dynamic storage device or element as a main memory 715 for storing information and instructions to be executed by the processors 710. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 715 includes a memory device 716, such as a stacked memory device, wherein the memory device includes a DRAM sense amplifier 717 having exposed nodes for upper and lower rail voltages of the sense amplifier, and further including a sense amplifier voltage control engine 718 that provides for independent modulation of the sense amplifier upper rail voltage and lower rail voltage over time.

The computing system 700 also may comprise a read only memory (ROM) 720 or other static storage device for storing static information and instructions for the processors 710. The computing system 700 may include one or more non-volatile memory elements 725 for the storage of certain elements.

One or more transmitters or receivers 740 may also be coupled to the interconnect 705. In some embodiments, the computing system 700 may include one or more ports 745 for the reception or transmission of data. The computing system 700 may further include one or more omnidirectional or directional antennas 747 for the reception of data via radio signals.

In some embodiments, the computing system 700 includes one or more input devices 750, where the input devices include one or more of a keyboard, mouse, touch pad, voice command recognition, gesture recognition, sensors or monitors (including sensors or monitors providing power and performance data), or other device for providing an input to a computing system.

The computing system 700 may also be coupled via the interconnect 705 to an output display 755. In some embodiments, the display 755 may include a liquid crystal display (LCD) or any other display technology, for displaying information or content to a user. In some environments, the display 755 may include a touch-screen that is also utilized as at least a part of an input device. In some environments, the display 755 may be or may include an audio device, such as a speaker for providing audio information.

The computing system 700 may also comprise a power device or system 780, which may comprise a power supply, a battery, a solar cell, a fuel cell, or other system or device for providing or generating power. The power provided by the power device or system 780 may be distributed as required to elements of the computing system 700.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, an apparatus includes a memory including a sense amplifier; a first node for an high voltage rail for the sense amplifier and a second node for a low voltage rail for the sense amplifier; one or more elements to provide a first voltage to the first node and a second voltage to the second node; and a voltage control engine to control the one or more elements, where the voltage control engine is to independently set a value of the first voltage and a value of the second voltage over time.

In some embodiments, the voltage control engine is a portion of a logic die of the apparatus.

In some embodiments, the apparatus is a stacked memory device, the memory including a stack of memory dies coupled with the logic die.

In some embodiments, the voltage control engine is to set one or more of the first voltage and the second voltage to provide a time period to boost sensing by the sense amplifier.

In some embodiments, the voltage control engine is to set one or more of the first voltage and the second voltage to provide a time period to protect the sense amplifier from short current conditions.

In some embodiments, the apparatus further includes a memory controller, wherein the memory controller provides commands to the voltage control engine. In some embodiments, the voltage control engine is a portion of the memory controller.

In some embodiments, the one or more elements of the apparatus include a first plurality of switching devices to switch between a first plurality of voltage levels for the first voltage and a second plurality of switching devices to switch between a second plurality of voltage levels for the first voltage.

In some embodiments, the voltage control engine of the apparatus is to perform a calibration procedure to determine times for setting the first and second voltages.

In some embodiments, a method includes setting a first voltage for an upper voltage rail for a sense amplifier of a memory at a first time; and setting a second voltage for a lower voltage rail for the sense amplifier at a second time, wherein the setting of the first and second voltage is controlled by a voltage control engine, and wherein the first voltage and the second voltage are set independently by the voltage control engine over time.

In some embodiments, the setting for the first voltage and the second voltage includes a boosting phase for increased sense operation. In some embodiments, the boosting phase includes setting the first voltage at a rail voltage that is higher than a normal upper rail voltage and setting the second voltage at a rail voltage that is lower than a normal lower rail voltage.

In some embodiments, the setting of the first voltage and the second voltage includes a protection phase to protect circuit elements from short current conditions. In some embodiments, the protection phase includes increasing the second voltage from an initial voltage level. In some embodiments, the protection phase follows a boosting phase to increase sense operation.

In some embodiments, the setting of the first voltage and the second voltage includes a calibration procedure to determine times for setting the first voltage and the second voltage. In some embodiments, the calibration procedure includes measuring a leakage current for the memory at different times.

In some embodiments, a system includes a processor to process data for the system; a touchscreen to display data and to receive commands; and a dynamic random access memory (DRAM) device including a primary sense amplifier for the DRAM device, a first node for an high voltage rail for the primary sense amplifier and a second node for a low voltage rail for the primary sense amplifier, one or more switching devices to provide a first voltage to the first node and a second voltage to the second node, and a voltage control engine to control the switching devices, where the voltage control engine is to independently set a value of the first voltage and a value of the second voltage over time.

In some embodiments, the voltage control engine is to set one or more of the first voltage and the second voltage to provide a time period to boost sensing by the primary sense amplifier.

In some embodiments, the voltage control engine is to set one or more of the first voltage and the second voltage to provide a time period to protect the primary sense amplifier from short current conditions.

In some embodiments, the one or more switching devices include a first plurality of switching devices to switch between a first plurality of voltage levels for the first voltage and a second plurality of switching devices to switch between a second plurality of voltage levels for the first voltage.

In some embodiments, a computer-readable storage medium having stored thereon data representing sequences of instructions that, when executed by a processor, cause the processor to perform operations including setting a first voltage for an upper voltage rail for a sense amplifier of a memory at a first time; and setting a second voltage for a lower voltage rail for the sense amplifier at a second time, wherein the setting of the first and second voltage is controlled by a voltage control engine, and wherein the first voltage and the second voltage are set independently by the voltage control engine over time.

In some embodiments, the setting for the first voltage and the second voltage includes a boosting phase for increased sense operation.

In some embodiments, the setting of the first voltage and the second voltage includes a protection phase to protect circuit elements from short current conditions.

What is claimed is:

1. An apparatus comprising:
   a memory including a sense amplifier;
   a first node for a high voltage rail for the sense amplifier and a second node for a low voltage rail for the sense amplifier;
   one or more elements to provide a first voltage to the first node and a second voltage to the second node; and
   a voltage control engine to control the one or more elements, wherein the voltage control engine is to independently set a first value of the first voltage and a second value of the second voltage over time to provide a first time period to boost sensing by the sense amplifier and a second time period following the first time period to protect the sense amplifier from short current conditions, the first time period including setting the first voltage at a first rail voltage that is higher than a normal high rail voltage and setting the second voltage at a second rail voltage that is lower than a normal low rail voltage, and the second time period including increasing the second voltage from the second rail voltage to a third rail voltage that is higher than the normal low rail voltage.

2. The apparatus of claim 1, wherein the voltage control engine is a portion of a logic die of the apparatus.

3. The apparatus of claim 2, wherein the apparatus is a stacked memory device, the memory including a stack of memory dies coupled with the logic die.

4. The apparatus of claim 1, further comprising a memory controller, wherein the memory controller provides commands to the voltage control engine.

5. The apparatus of claim 4, wherein the voltage control engine is a portion of the memory controller.

6. The apparatus of claim 1, wherein the one or more elements include a first plurality of switching devices to switch between a first plurality of voltage levels for the first voltage and a second plurality of switching devices to switch between a second plurality of voltage levels for the second voltage.

7. The apparatus of claim 1, wherein the voltage control engine is to perform a calibration procedure to determine times for setting the first and second voltages for the first time period and the second time period.

8. The apparatus of claim 1, wherein the second time period further includes maintaining the first voltage at the first rail voltage.

9. The apparatus of claim 8, wherein the voltage control engine is further to set the first voltage and the second voltage to provide a third time period following the second time period, the third time period including reducing the first voltage from the first rail voltage to the normal high rail voltage and reducing the second voltage from the third rail voltage to the normal low rail voltage.

10. The apparatus of claim 1, wherein the first time period further includes setting the first voltage at the first rail voltage at a first time and setting the second voltage at the second rail voltage at a second time, the first time being earlier than the second time.

11. A method comprising:
setting a first voltage for an upper voltage rail for a sense amplifier of a memory at a first time; and
setting a second voltage for a lower voltage rail for the sense amplifier at a second time;
wherein the setting of the first and second voltage is controlled by a voltage control engine, and wherein the first voltage and the second voltage are set independently by the voltage control engine over time; and
wherein the setting of the first voltage and the second voltage by the voltage control engine includes a boosting phase for increased sense operation and a protection phase following the boosting phase to protect circuit elements from short current conditions, the boosting phase including setting the first voltage at a first rail voltage that is higher than a normal upper rail voltage and setting the second voltage at a second rail voltage that is lower than a normal lower rail voltage, and the protection phase including increasing the second voltage from the second rail voltage to a third rail voltage that is higher than the normal lower rail voltage.

12. The method of claim 11, wherein the setting of the first voltage and the second voltage includes a calibration procedure to determine times for setting the first voltage and the second voltage for the boosting phase and the protection phase.

13. The method of claim 12, wherein the calibration procedure includes measuring a leakage current for the memory at different times.

14. The method of claim 11, wherein the protection phase further includes maintaining the first voltage at the first rail voltage.

15. The method of claim 14, wherein the setting of first voltage and the second voltage further includes a normal phase following the protection phase, the normal phase including reducing the first voltage from the first rail voltage to the normal upper rail voltage and reducing the second voltage from the third rail voltage to the normal lower rail voltage.

16. The method of claim 11, wherein the boost phase further includes setting the first voltage at the first rail voltage at a first time and setting the second voltage at the second rail voltage at a second time, the first time being earlier than the second time.

17. A system comprising:
a processor to process data for the system;
a touchscreen to display data and to receive commands; and\
a dynamic random access memory (DRAM) device including:
a primary sense amplifier for the DRAM device,
a first node for a high voltage rail for the primary sense amplifier and a second node for a low voltage rail for the primary sense amplifier,
one or more switching devices to provide a first voltage to the first node and a second voltage to the second node, and
a voltage control engine to control the switching devices, wherein the voltage control engine is to independently set a first value of the first voltage and a second value of the second voltage over time to provide a first time period to boost sensing by the sense amplifier and a second time period following the first time period to protect the sense amplifier from short current conditions, the first time period including setting the first voltage at a first rail voltage that is higher than a normal high rail voltage and setting the second voltage at a second rail voltage that is lower than a normal low rail voltage, and the second time period including increasing the second voltage from the second rail voltage to a third rail voltage that is higher than the normal low rail voltage.

18. The system of claim 17, wherein the one or more switching devices include a first plurality of switching devices to switch between a first plurality of voltage levels for the first voltage and a second plurality of switching devices to switch between a second plurality of voltage levels for the second voltage.

19. The system of claim 17, wherein the second time period further includes maintaining the first voltage at the first rail voltage.

20. The system of claim 19, wherein the voltage control engine is further to set the first voltage and the second voltage to provide a third time period following the second time period, the third time period including reducing the first voltage from the first rail voltage to the normal high rail voltage and reducing the second voltage from the third rail voltage to the normal low rail voltage.

21. The system of claim 17, wherein the first time period further includes setting the first voltage at the first rail voltage at a first time and setting the second voltage at the second rail voltage at a second time, the first time being earlier than the second time.

22. A non-transitory computer-readable storage medium having stored thereon data representing sequences of instructions that, when executed by a processor, cause the processor to perform operations comprising:
setting a first voltage for an upper voltage rail for a sense amplifier of a memory at a first time; and
setting a second voltage for a lower voltage rail for the sense amplifier at a second time;
wherein the setting of the first and second voltage is controlled by a voltage control engine, and wherein the first voltage and the second voltage are set independently by the voltage control engine over time; and wherein the setting of the first voltage and the second voltage by the voltage control engine includes a boosting phase for increased sense operation and a protection phase following the boosting phase to protect circuit elements from short current conditions, the boosting phase including setting the first voltage at a first rail voltage that is higher than a normal upper rail voltage and setting the second voltage at a second rail voltage that is lower than a normal lower rail voltage, and the protection phase including increasing the second voltage from the second rail voltage to a third rail voltage that is higher than the normal lower rail voltage.

23. The medium of claim 22, wherein the protection phase further includes maintaining the first voltage at the first rail voltage.

24. The medium of claim 23, wherein the setting of first voltage and the second voltage further includes a normal phase following the protection phase, the normal phase including reducing the first voltage from the first rail voltage to the normal upper rail voltage and reducing the second voltage from the third rail voltage to the normal lower rail voltage.

25. The medium of claim 22, wherein the boost phase further includes setting the first voltage at the first rail voltage at a first time and setting the second voltage at the second rail voltage at a second time, the first time being earlier than the second time.

* * * * *